(12) United States Patent
Qidwai

(10) Patent No.: US 8,300,446 B2
(45) Date of Patent: Oct. 30, 2012

(54) FERROELECTRIC RANDOM ACCESS MEMORY WITH SINGLE PLATE LINE PULSE DURING READ

(75) Inventor: Saim Ahmad Qidwai, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 220 days.

(21) Appl. No.: 12/966,963

(22) Filed: Dec. 13, 2010

(65) Prior Publication Data

US 2012/0147654 A1   Jun. 14, 2012

(51) Int. Cl.
*G11C 11/22* (2006.01)

(52) U.S. Cl. .............. 365/145; 365/189.14; 365/189.15; 365/203

(58) Field of Classification Search ............... 365/49.13, 365/65, 109, 117, 145, 203
See application file for complete search history.

(56) References Cited

U.S. PATENT DOCUMENTS

| | | | |
|---|---|---|---|
| 6,198,651 | B1 | 3/2001 | Lee et al. |
| 7,733,682 | B2 | 6/2010 | Madan |
| 2002/0122328 | A1* | 9/2002 | Oowaki et al. ................ 365/145 |
| 2006/0067138 | A1* | 3/2006 | Ogiwara et al. ......... 365/189.09 |

* cited by examiner

*Primary Examiner* — Pho M Luu
*Assistant Examiner* — Thao Bui
(74) *Attorney, Agent, or Firm* — Rose Alyssa Keagy; Wade J. Brady, III; Frederick J. Telecky, Jr.

(57) ABSTRACT

A ferroelectric random access memory (FRAM) with reduced cycle time. During a read cycle, plate line voltages are boosted to a voltage to both transfer charge from the selected row of FRAM cells to corresponding bit lines, and to fully polarize a data state in the selected FRAM cells. In one embodiment of the invention, the fully polarized data states is present in those cells that previously stored that data state; for those cells storing the opposite state, a write-back pulse is executed. In another embodiment of the invention, the fully polarized data state results for each of the selected memory cells, by applying a plate line boost voltage of a higher magnitude. Those cells that are to store the opposite data state, as may be determined following error correction, are written back with that data state.

19 Claims, 7 Drawing Sheets

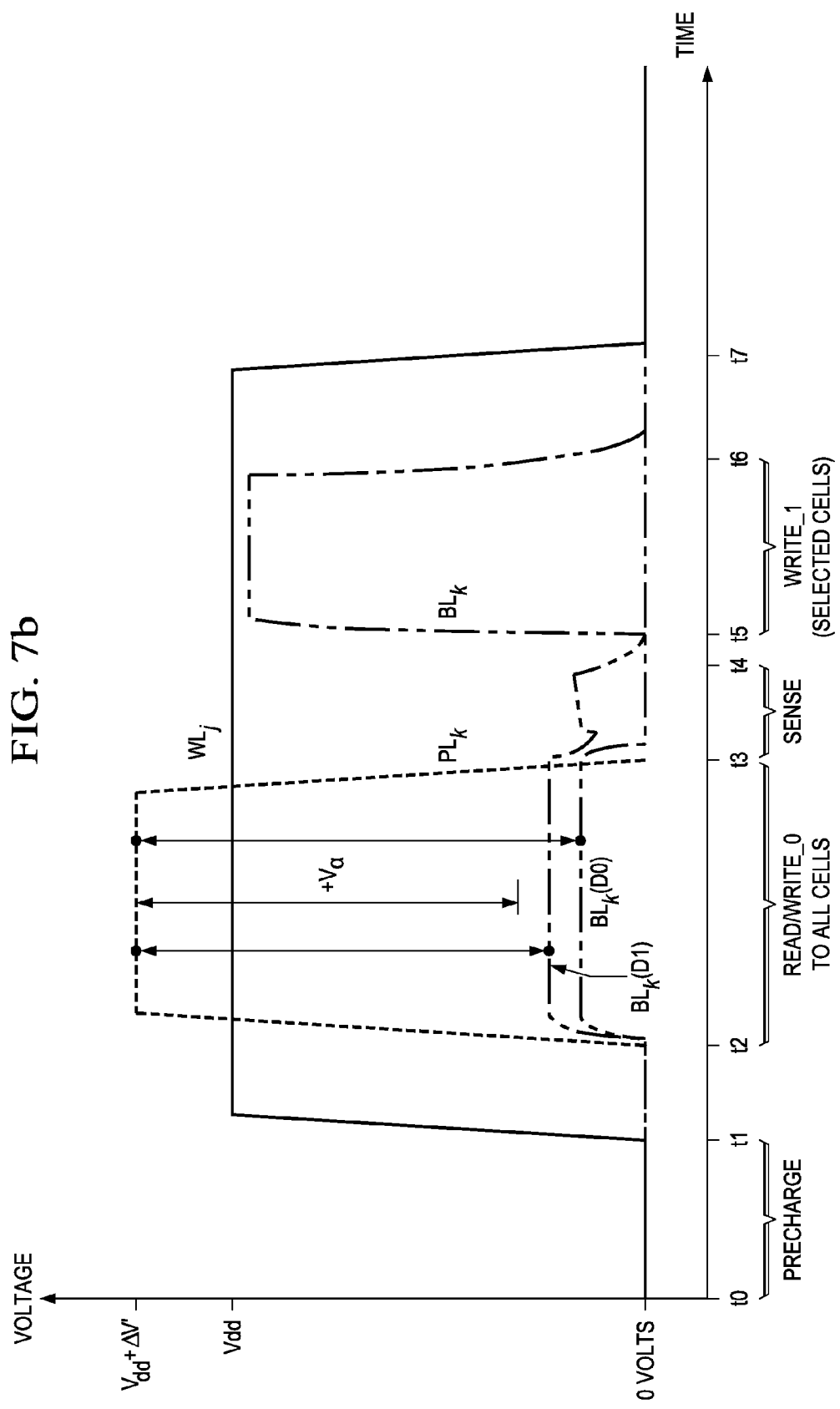

FERROELECTRIC RANDOM ACCESS MEMORY WITH SINGLE PLATE LINE PULSE DURING READ

CROSS-REFERENCE TO RELATED APPLICATIONS

Not applicable.

STATEMENT REGARDING FEDERALLY SPONSORED RESEARCH OR DEVELOPMENT

Not applicable.

BACKGROUND OF THE INVENTION

This invention is in the field of solid-state memory of the ferroelectric type. Embodiments of this invention are directed to circuit techniques for improving read margin, and reducing power consumption and memory cycle times, in ferroelectric random access memories (FRAMs).

Many modern electronic devices and systems now include substantial computational capability for controlling and managing a wide range of functions and useful applications. Many of these electronic devices and systems are now portable or handheld devices. For example, many mobile devices with significant computational capability are now available in the market, including modern mobile telephone handsets such as those commonly referred to as "smartphones", personal digital assistants (PDAs), mobile Internet devices, tablet-based personal computers, handheld scanners and data collectors, personal navigation devices, implantable medical devices, and the like.

A recently developed technology for realizing non-volatile solid-state memory devices involves the construction of capacitors in which the dielectric material is a polarizable ferroelectric material, such as lead zirconate titanate (PZT) or strontium-bismuth-tantalate (SBT). Hysteresis in the charge-vs.-voltage (Q-V) characteristic, based on the polarization state of the ferroelectric material, enables the non-volatile storage of binary states in those capacitors. In contrast, conventional MOS capacitors lose their stored charge on power-down of the device. It has been observed that ferroelectric capacitors can be constructed by processes that are largely compatible with modern CMOS integrated circuits, for example by forming the capacitors above the transistor level, between overlying levels of metal conductors.

Ferroelectric technology is now utilized in on-volatile solid-state read/write memory devices. These memory devices, commonly referred to as "ferroelectric RAM", or "FeRAM", or "FRAM" devices, now appear in many electronic systems, particularly portable electronic devices and systems. FRAM memories are especially attractive in implantable medical devices, such as pacemakers and defibrillators.

As known in the art, FRAM cells may be implemented in various forms, including as a one-transistor, one-capacitor (1-T, 1-C) memory cell similar to a typical DRAM cell. Other implementations include 2-T, 2-C cells, in which the two capacitors differentially define the stored data state, and six-transistor (6-T) SRAM cells that include one or two ferroelectric capacitors that are programmed to retain the SRAM data state after power is removed.

FIG. 1a illustrates the construction of a conventional 1-T, 1-C FRAM memory cell 4, as is now typically used in modern FRAMs. Ferroelectric capacitor 5 serves as the non-volatile memory element, and is constructed as a parallel-plate solid-state capacitor with ferroelectric dielectric material, such as PZT, as the capacitor dielectric. In this example, FRAM cell 4 resides in row j and column k of an array of similarly constructed FRAM cells 4. One plate of capacitor 5 is connected to plate line $PL_j$ for the $j^{th}$ row of the array, and the other plate of capacitor 5 is connected to one end of the source/drain path of n-channel metal-oxide-semiconductor (MOS) transistor 6. The other end of the source/drain path of transistor 6 is connected to bit line $BL_k$ for the $k^{th}$ column of the array, and the gate of transistor 6 is connected to word line $WL_j$ of the $j^{th}$ row of the array. As such, transistor 6 serves as a pass transistor in the DRAM sense, connecting ferroelectric capacitor 5 to bit line $BL_k$ upon selection of row j according to a row address that indicates energizing of word line $WL_j$.

As mentioned above, the data storage mechanism of FRAM cells is the charge-voltage hysteresis of the ferroelectric capacitor dielectric. FIG. 1b illustrates an example of a Q-V characteristic of a conventional ferroelectric capacitor, such as capacitor 5 in cell 4 of FIG. 1a. As shown, the charge (Q) stored across the conductive plates depends on the voltage applied to the plates (V), and also on the recent history of that voltage. If the voltage V applied across the capacitor plates exceeds a "coercive" voltage $+V_\alpha$, the capacitor polarizes into the "+1" state. According to this characteristic, once polarized to the "+1" state, so long as voltage V remains above coercive voltage $-V_\beta$, the capacitor exhibits a stored charge of $+Q_1$. Conversely, if an applied voltage V is more negative than coercive voltage $-V_\beta$, the capacitor is polarized into the "-1" state, and will exhibit a stored charge of $-Q_2$.

An important characteristic of ferroelectric capacitors, for purposes of non-volatile storage in integrated circuits, is the difference in capacitance exhibited by a ferroelectric capacitor its two polarized states. As fundamental in the art, the capacitance of an element refers to the ratio of stored charge to applied voltage. In the context of a ferroelectric capacitor, the change in polarization state that occurs upon application of a polarizing voltage is reflected by the amount of charge stored by the capacitor as a result. As shown in FIG. 1b, the polarization of ferroelectric capacitor 5 from its "-1" state to its "+1" state is reflected by a relatively high capacitance C(-1), reflecting significant polarization charge that is stored as a result of the change of polarization state as the voltage exceeds its coercive voltage $V_\alpha$. On the other hand, if capacitor 5 is already in its "+1" state, little polarization charge is stored as a result of the application of that voltage, and thus the capacitance C(+1) is relatively small, since the ferroelectric domains of capacitor 5 are already aligned prior to the application of the voltage. As such, the stored data state in FRAM cell 4 can be read by interrogating the capacitance of ferroelectric capacitors to discern its previous polarized state.

FIG. 2 is a timing diagram illustrating the reading and writing of FRAM cell 4 of FIG. 1a, in a conventional FRAM. As well-known in the art, sensing of the state of 1-T, 1-C memory cells (such as in DRAMs and FRAMs) is carried out by a differential MOS sense amplifier connected on one side to a bit line $BL_k$ and on another side to a reference voltage that is set approximately half-way between the "0" and "1" data states (e.g., as established by a "dummy" cell). The cycle shown in FIG. 2 begins with the precharge of bit line $BL_k$ to a ground voltage (near 0 volts in this example), with both word line $WL_j$ and plate line $PL_j$ also near ground. Word line $WL_j$ is then energized to a high voltage (e.g., at or near power supply voltage $V_{dd}$), upon a received memory address indicating row j for access. In this conventional operation, a three-pulse operation is performed within each pulse of word line $WL_j$. The first pulse in this sequence is a "read" of cell 4 in row j and each column k (one of which is shown in FIG. 2), initiated by plate line $PL_j$ being driven to a high voltage.

In this "read" pulse, referring back to FIGS. 1a and 1b, plate line $PL_j$ is driven to a high voltage during the word line pulse, with bit line $BL_k$ having been precharged to ground. Considering the voltage V of the Q-V curve of FIG. 1b as corresponding to the voltage differential between plate line $PL_j$ and bit line $BL_k$ (i.e., VPL–VBL), this pulse of plate line $PL_j$ amounts to raising of the voltage V above 0 volts, toward "coercive" voltage $+V_\alpha$. If capacitor 5 is in its "–1" polarization state, this plate line pulse will cause capacitor 5 to exhibit capacitance C(–1), transferring charge to bit line $BL_k$; conversely, if capacitor 5 is in its "+1" state, the plate line pulse will follow capacitance C(+1), transferring much less charge to bit line $BL_k$. This charge transfer develops a voltage response at bit line $BL_k$ as shown in FIG. 2 by plots $BL_k(D1)$ for the "1" data state (resulting from the "–1" polarization state) and $BL_k(D0)$ for the "0" data state (resulting from the "+1" polarization state).

In most modern FRAMs of this construction, plate line $PL_j$ is then de-energized after the charge transfer to bit line $BL_k$, after which the differential sense amplifier senses the transferred charge (by determining the polarity of the differential voltage between bit line $BL_k$ and a reference level), and develops its full differential data state as a result. This "off-pulse" sensing has been observed to provide better read margin than "on-pulse" sensing (i.e., flipping of the sense amplifier during the plate line pulse), because the bit line voltages are charged above ground for both data states during the "read" pulse, as shown in FIG. 2.

In either data state, the read of FRAM cell 4 in this manner is destructive, in that capacitor 5 is at least partially polarized by this operation. Conventional FRAM operation thus restores the sensed data state. In the conventional approach of FIG. 2, the "0" data state is written to every FRAM cell 4 in row j, by again pulsing plate line $PL_j$ to a high voltage while holding bit line $BL_k$ (and all bit lines corresponding to cells 4 in the selected row j) at ground. This pulse writes a "0" to each of these cells 4, by applying a full voltage beyond coercive voltage $+V_\alpha$ across each ferroelectric capacitor 5. Following this unconditional "0" write pulse, a "1" data state is then written into those FRAM cells 4 in this row j that previously stored a "1" data state. This write "1" pulse consists of holding plate line $PL_j$ low for row j, while driving bit lines $BL_k$ corresponding to those "1" data state cells 4 to a high voltage. This operation applies a negative voltage beyond coercive voltage $-V_\beta$ (FIG. 1b) across the corresponding capacitors 5, polarization those capacitors into the "–1" state. Of course, the selection of which bit lines $BL_k$ receive this "1" write pulse can be modified from that indicated by the sensed data states, for example in a read-modify-write operation or as a result of error correction.

This conventional FRAM memory operation has been observed to provide reasonably good data stability and performance. However, as evident from FIG. 2, the necessity to perform the multiple pulses and intervals within each read cycle ("read", "sense", "write 0", "write 1") limits memory performance by requiring relatively long cycle times.

By way of further background, commonly assigned U.S. Pat. No. 7,733,682 B2, incorporated herein by this reference, describes a ferroelectric memory having a plate line driver circuit that applies a "boost" voltage, above the power supply voltage, to the plate lines of the memory during memory access. As described therein, application of the "boost" plate line voltage during the "read" operation results in better read margin.

BRIEF SUMMARY OF THE INVENTION

Embodiments of this invention provide a ferroelectric solid-state memory and method of operating the same that enable operation at significantly shorter cycle times.

Embodiments of this invention provide such a memory and method in which shorter cycle times are attained without degrading read margin.

Embodiments of this invention provide such a memory and method that may be implemented in ferroelectric memories with minimum additional circuitry.

Other objects and advantages provided by embodiments of this invention will be apparent to those of ordinary skill in the art having reference to the following specification together with its drawings.

This invention may be implemented into a ferroelectric memory, either embedded into a large-scale integrated circuit or as a standalone solid-state memory, of the destructive read type. An elevated plate line voltage, for example above an array power supply voltage, is applied during the charge transfer portion of a read cycle, so that one of the write-back pulses can be eliminated from the memory cycle.

According to some embodiments of the invention, the elevated plate line voltage may be at a voltage sufficient to "write back" a "0" data state into those cells that originally stored the "0" state, eliminating the need to perform a separate write operation to the "0" data state. Those cells previously storing a "1" data state are then restored to their prior state.

According to other embodiments of the invention, the elevated plate line voltage is at a yet higher voltage during the charge transfer pulse, sufficient to write a "0" data state into all cells, regardless of data state. A separate write to "0" pulse is unnecessary. Those cells previously storing a "1" data state are then restored to their prior state.

BRIEF DESCRIPTION OF THE SEVERAL VIEWS OF THE DRAWING

FIGS. 7a and 7b are timing diagrams illustrating the operation of the memory of FIG. 4, according to embodiments of the invention.

DETAILED DESCRIPTION OF THE INVENTION

This invention will be described in connection with certain of its embodiments, namely as implemented into ferroelectric random access memory (FRAM or FeRAM) in which the memory cells are constructed in the well-known 1-T, 1-C arrangement, because it is contemplated that this invention is especially beneficial when applied to such circuits. However, it is also contemplated that other memory circuits and architectures, including FRAM cells of different construction, may also greatly benefit from this invention. Accordingly, it is to be understood that the following description is provided by way of example only, and is not intended to limit the true scope of this invention as claimed.

As mentioned above, this invention is suitable for use in connection with semiconductor memory circuits, whether serving as a stand-alone integrated circuit or as embedded into larger scale integrated circuits such as microprocessors, microcontrollers, or the so-called "system on a chip" (SoC) integrated circuits. This invention is also suitable for use in logic circuits, including combinational and sequential logic circuits, as well as programmable logic circuits. Examples of embodiments of this invention in memory and logic circuits will be described in this specification, it being understood that such descriptions of implementations of this invention are not to be interpreted in a limiting fashion.

Figure 3:
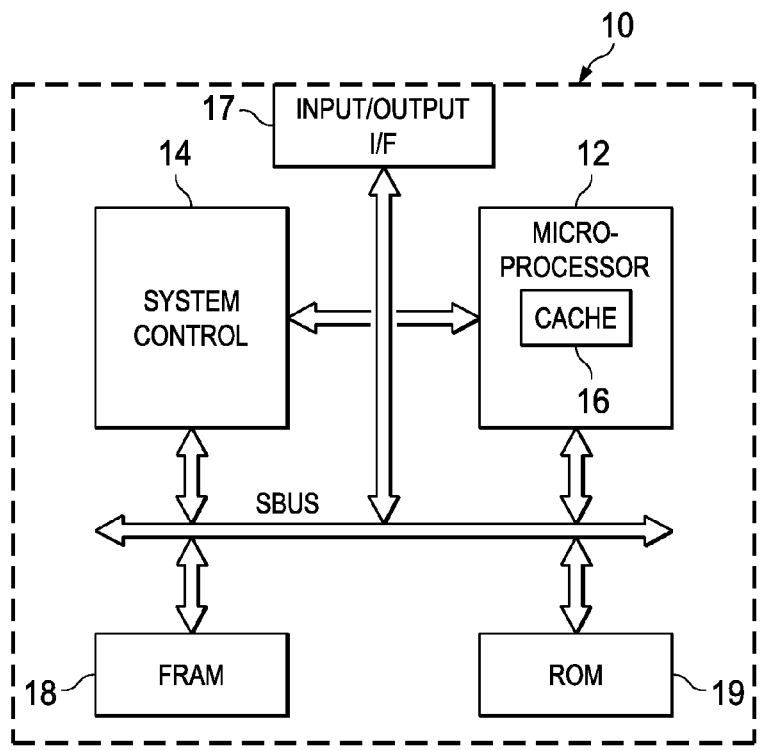
FIG. 3 is an electrical diagram, in block form, of a large scale integrated circuit incorporating a ferroelectric memory, constructed according to embodiments of the invention.

FIG. 3 illustrates an example of SoC large-scale integrated circuit 10, which is a single-chip integrated circuit into which an entire computer architecture is realized. As such, in this example, integrated circuit 10 includes a central processing unit of microprocessor 12, which is connected to system bus SBUS. Various memory resources, including ferroelectric random access memory (FRAM) 18 and read-only memory (ROM) 19, reside on system bus SBUS and are thus accessible to microprocessor 12. Typically, ROM 19 serves as program memory, storing the program instructions executable by microprocessor 12, while FRAM 18 serves as data memory; in some cases, program instructions may reside in FRAM 18 for recall and execution by microprocessor 12. Cache memory 16 (such as level 1, level 2, and level 3 caches, each typically implemented as static RAM) provides another memory resource, and resides within microprocessor 12 itself and therefore does not require bus access. Other system functions are shown, in a generic sense, in integrated circuit 10 by way of system control 14 and input/output interface 17.

Those skilled in the art having reference to this specification will recognize that integrated circuit 10 may include additional or alternative functions to those shown in FIG. 3, or may have its functions arranged according to a different architecture from that shown in FIG. 3. The architecture and functionality of integrated circuit 10 is thus provided only by way of example, and is not intended to limit the scope of this invention.

Figure 1A:
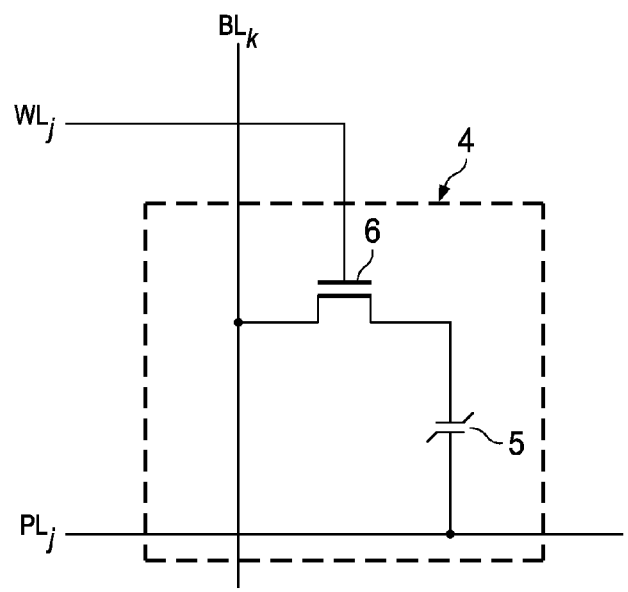
FIG. 1a is an electrical diagram, in schematic form, of a conventional one-transistor, one-capacitor (1-T, 1-C) ferroelectric memory cell.
Figure 4:
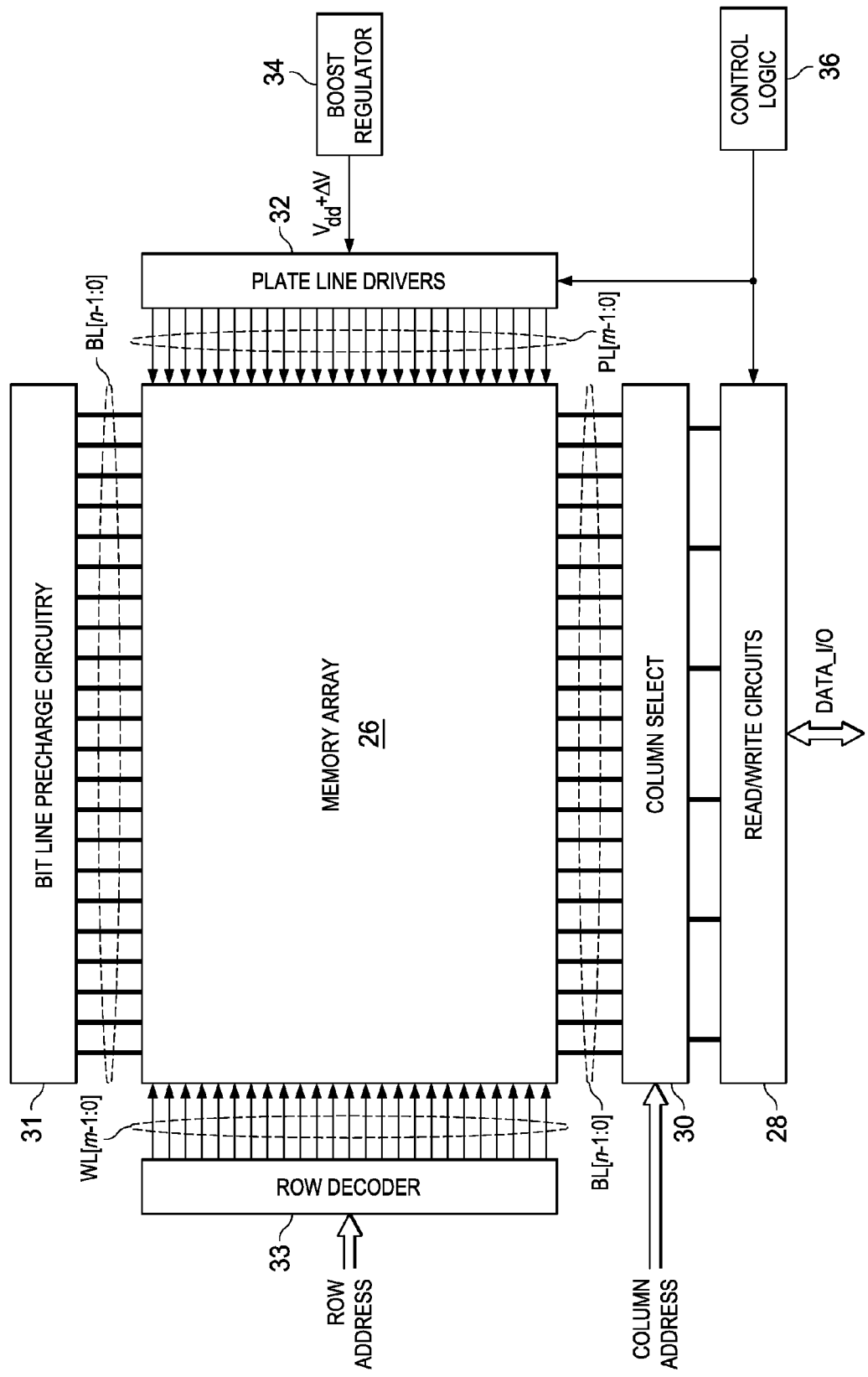
FIG. 4 is an electrical diagram, in block form, of a ferroelectric memory constructed according to embodiments of the invention.

FIG. 4 shows an example of the architecture of FRAM 18 implementing an embodiment of this invention. Memory array 26 includes non-volatile FRAM memory cells of the 1-T, 1-C construction described above relative to FIG. 1a, arranged in m rows and n columns. FRAM memory cells in the same column share a pair of bit lines BL[n−1:0], and memory cells in the same row share one of word lines WL[m−1:0]. Row decoder 33 receives a row address value indicating the row of memory array block 26 to be accessed, and includes word line drivers that energize the one of word lines WL[m−1:0] corresponding to that row address value. Column select circuit 30 receives a column address value, and in response selects one or more pairs of bit lines BL[n−1:0] for connection to read/write circuits 28, which may be realized as conventional sense amplifiers and write circuits as known in the art for FRAM devices. Read/write circuits 28 are coupled to bus DATA_I/O, by way of which output data and input data are communicated from and to read/write circuits 28 and thus the addressed memory cells within memory array 26, in the conventional manner. Bit line precharge circuitry 31 is provided to apply a desired precharge voltage to the pairs of bit lines BL[n−1:0] at the beginning of read and write operations, and during standby periods.

Of course, many variations in the particular memory arrangement can be realized within this architecture, and by way of variations to this architecture, in connection with this embodiment of the invention. For example, each FRAM cell may alternatively be constructed of the 2-T/2-C type, with one ferroelectric capacitor and pass transistor in each cell coupled to one bit line and the other capacitor and transistor combination coupled to a complementary bit line. Each of the two transistors receive the same word line level in each cycle, and also the same plate line voltage from plate line drivers 32 (described below). In write operations, the complementary bit lines in each column carry complementary data levels to polarize the two ferroelectric capacitors within each cell to opposite states, differentially defining the stored data state. Other cell constructions and memory architectures may alternatively realize FRAM 18 according to embodiments of this invention, without departing from this invention as hereinafter claimed. The following description will refer to the example of the 1-T, 1-C cell 4 of FIG. 1a, however, for the sake of clarity.

As described above, the memory cells within memory array 26 have non-volatile capability provided by ferroelectric capacitors that can be polarized to retain the current state of corresponding memory cells. In this regard, the memory of FIG. 4 also includes plate line drivers 32, which drive plate line conductors PL[m−1:0] that are connected to ferroelectric capacitors in memory cells of memory array 26, in the manner described above relative to FIG. 1a. Typically, these plate lines PL[m−1:0] are dedicated to groups of one or more rows, in similar manner as word lines WL[m−1:0], and thus are selectively energized based on the row address decoded by row decoder 33. Plate line drivers 32, as well as read/write circuits 28 and other circuitry within the memory, are also controlled by control logic 36, which refers generally to logic circuitry that controls the operation of plate line drivers 32, bit line precharge circuitry 31, and read/write circuits 28, in response to clock signals and control signals (not shown).

According to embodiments of this invention, as will be described below, FRAM 18 includes boost regulator 34, which generates an elevated voltage $V_{dd}+\Delta V$ that is applied to plate line drivers 32, and in turn to each of plate lines PL[m−1:0]. Alternatively, a "bootstrapped" voltage $V_{dd}+\Delta V$ may be applied to plate lines PL[m−1:0] at the appropriate time, according to other embodiments of this invention. Each of these approaches will be described in further detail below.

Control logic 36 in FRAM 18 according to embodiments of this invention may be constructed in the usual manner for modern FRAMs, generally distributed around and among the various functions shown in FIG. 4; the illustration of a single control logic block in FIG. 4 is presented for clarity of the drawing. It is contemplated that those skilled in the art having reference to this specification, and particularly to the description of the various control signals and timing of those control signals for embodiments of this invention, will be readily able to construct and realize control logic 36 in an appropriate way for each particular implementation, without undue experimentation. It is therefore contemplated that the description of the various control signals and timing in the operation of FRAM 18 in this specification will be sufficient for such construction, without requiring detailed description of any particular logic realization for control logic 36. As such, no such detailed construction for control logic 36 will be presented, for the sake of clarity.

Figure 5:
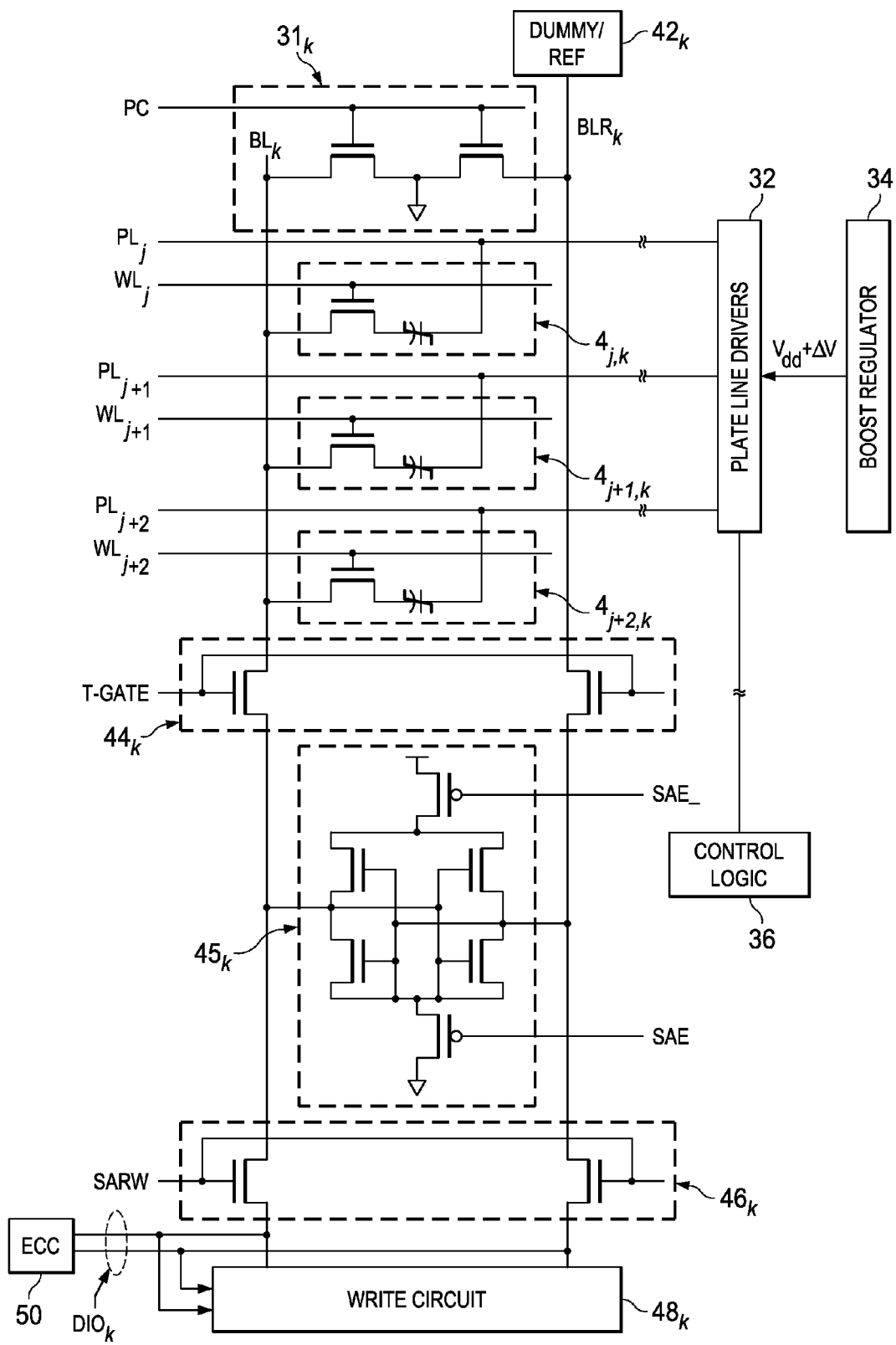
FIG. 5 is an electrical diagram, in schematic form, of a column of ferroelectric memory cells and supporting circuitry in the memory of FIG. 4, according to embodiments of the invention.

FIG. 5 illustrates the construction of a representative column k and its sense circuitry in memory array 26 of this example of FRAM 18. In this example, three FRAM cells $4_{j,k}$ through $4_{j+2,i}$, associated with rows j through j+2, respectively, are illustrated in connection with column k; it will be of course understood by those skilled in the art that typically many more cells 4 will reside in column k and the other columns of memory array 26. In the example of FIG. 5, each FRAM cell 4 is constructed of the 1-T/1-C type, with one ferroelectric capacitor and pass transistor coupled to bit line $BL_k$. For purposes of differential sensing, as will be described below, dummy/reference $42_k$ is coupled to reference bit line $BLR_k$ for this column k. Dummy/reference $42_k$ may be a "dummy" cell that presents a mid-level of charge to reference bit line $BLR_k$ for sensing purposes. Alternatively, as mentioned above, each FRAM cell 4 may alternatively be constructed as a 2-T/2-C ferroelectric cell, in which the two ferroelectric capacitors are polarized to opposite states to develop the differential sensed data state.

Each of FRAM cells $4_{j,k}$ through $4_{j+2,k}$ receive word line signals from word line decoder 33 word lines $WL_j$ through $WL_{j+2}$, respectively, in the conventional manner. According to embodiments of this invention, plate line drivers 32 apply the appropriate voltages to plate lines $PL_j$ through $PL_{j+2}$, respectively, to accomplish read and write operations of selected cells $4_{j,k}$ through $4_{j+2,k}$. According to this embodiment of the invention, as mentioned above, boost regulator 34 generates an elevated voltage $V_{dd}+\Delta V$ that is applied to plate line drivers 32, and in turn to each of plate lines $PL_j$ through $PL_{j+2}$, during read cycles in this example. Boost regulator 34 may be constructed as a conventional voltage regulator that generates the desired regulated voltage $V_{dd}+\Delta V$ above power supply voltage $V_{dd}$. Alternatively, boost regulator 34 may generate an incremental regulated voltage $\Delta V$ that is summed with power supply voltage $V_{dd}$ within plate line drivers 32. In either case an enhanced voltage is applied to the selected one of plate lines PL[m−1:0] during a particular portion of the memory access cycle, as will be described in further detail below.

Figure 6:
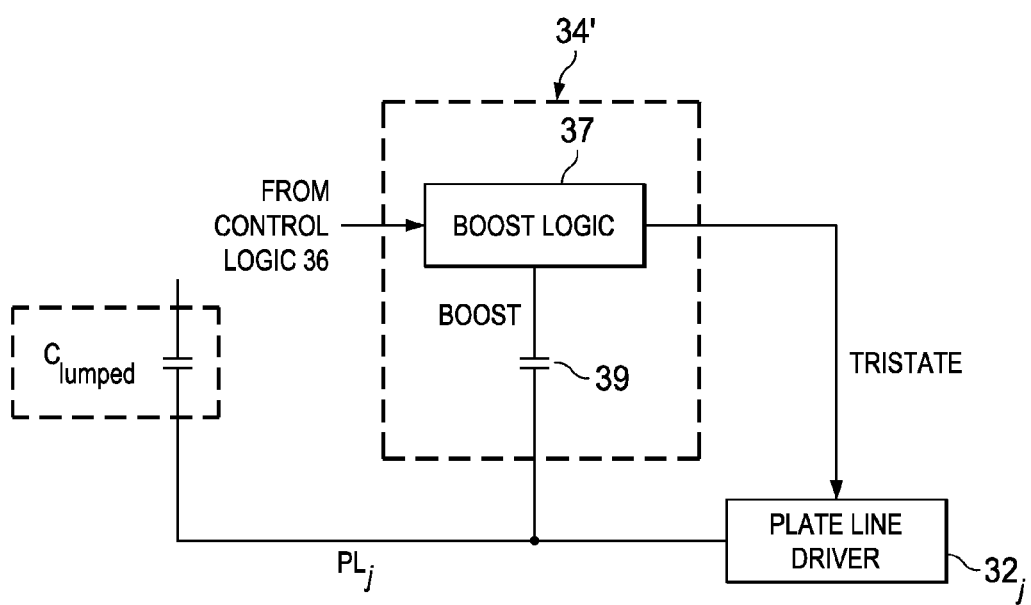
FIG. 6 is an electrical diagram, in schematic form, of a circuit for boosting the plate line voltage in the memory of FIG. 4, according to embodiments of the invention.

Alternatively, as shown in FIG. 6, boost circuit 34' may instead be implemented in the form of a "bootstrap" circuit. Commonly assigned U.S. Pat. No. 7,733,682 B2, incorporated herein by this reference, describes applicable circuit arrangements for generating a "boosted" plate line voltage, each of which may be implemented into FRAM 18 according to embodiments of this invention. To summarize, boost circuit 34' in the example of FIG. 6 includes boost logic 37, which receives various timing and control signals from control logic 36 and the like. Boost logic 37 issues control signal TRISTATE to plate line driver $32_j$ for row j, and also issues control signal BOOST to one plate of its capacitor 39, the other plate of which is connected to plate line $PL_j$. While boost circuit 34' is shown in connection with a single row j, it is contemplated that similar functionality will be provided for each of the rows of array 26. As such, boost circuit 34' may be distributed on a row-by-row basis, and in such an implementation may in fact be incorporated within plate line drivers 32, or alternatively may generate its various signals and boost voltage from a single instance to the appropriate selected row j as indicated by the row address. It is contemplated that the particular construction of boost circuit 34' for each particular implementation is within the ability of those of ordinary skill in the art having reference to this specification, and to the above-incorporated U.S. Pat. No. 7,733,682 B2.

In the operation of boost circuit 34' of FIG. 6, at the appropriate time of an access of FRAM 18 after the initial driving of plate line $PL_j$, boost logic 37 issues control signal TRISTATE to plate line driver $32_j$ for row j. With plate line $PL_j$ then floating from its plate line driver $32_j$, seeing a "lumped" capacitance $C_{lumped}$ of plate line $PL_j$ itself plus each of ferroelectric capacitors 5 in cells 4 in its row j, boost logic 37 then issues a pulse on line BOOST to capacitor 39. This boost pulse causes the voltage of plate line $PL_j$ to increase by an amount depending on the amplitude of pulse BOOST and the relative capacitances of capacitor 39 and the plate line and cell capacitances. It is contemplated that those skilled in the art having reference to this specification can readily realize the appropriate design in this regard. As a result, an increased voltage $V_{dd}+\Delta V$ above power supply voltage $V_{dd}$ is applied to plate line $PL_j$ by boost circuit 34'.

Referring back to FIG. 5, bit line precharge circuitry $31_k$ for column k is coupled to bit lines $BL_k$, $BLR_k$ and a reference potential, such as ground. In this example, bit line precharge circuitry $31_k$ includes a pair of transistors, each with its source/drain path connected between one of bit lines $BL_k$, $BLR_k$ and ground, and with its gate receiving control signal PC from control logic 36 (FIG. 4) or other appropriate control circuitry.

Referring back to the example of FIG. 5, sense amplifier $45_k$ is associated with column k, and is constructed in the conventional cross-coupled CMOS inverter fashion, with head and tail enable transistors receiving complementary control signals SAE_, SAE, respectively, from control logic 36. Bit lines $BL_k$, $BLR_k$ are coupled to the sense nodes of sense amplifier $45_k$ by transfer gate $44_k$, which responds to control signal T-gate from control logic 36. On its opposite side from transfer gate $44_k$, the sense nodes of sense amplifier $45_k$ are selectively coupled to differential data input/output lines $DIO_k$ by column enable transistors $46_k$ under the control of control signal SARW from column decoder 30, perhaps gated by control logic 36. Data I/O lines $DIO_k$ are in turn coupled to error correction circuit 50, and to write circuit $48_k$. Write circuit $48_k$ includes the appropriate circuitry for applying the desired voltages to bit line $BL_k$ to perform the desired write operations, as will be described in detail below.

Figure 7A:
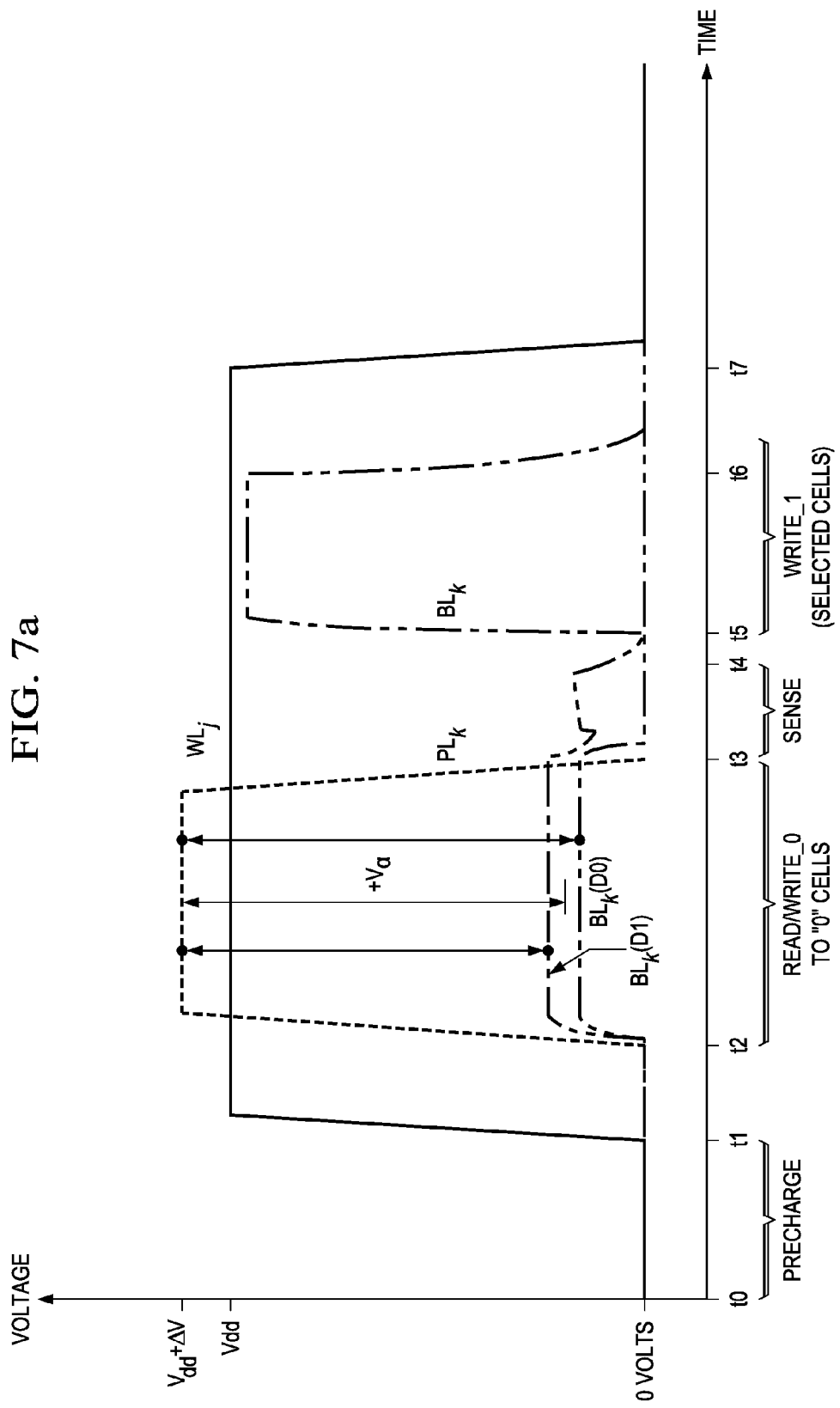

Referring now to FIG. 7a, the operation of FRAM 18 in performing a read of cell $4_{j,k}$ shown in FIG. 5 according to one embodiment of the invention will now be described, by way of example. The read of cell $4_{j,k}$ begins at time t0 with the precharge of bit lines $BL_k$, $BLR_k$ by precharge circuitry $31_k$, in response to an active level on line PC from control logic 36. Typically, each column in the portion of array 26 being read in this cycle will be simultaneously precharged at this point of the cycle. This precharge is performed, of course, prior to the energizing of any of word lines $WL_j$ through $WL_{j+2}$ in this example, and as such all cells 4 are isolated from the bit lines during this time. As evident from FIGS. 5 and 6a, bit lines $BL_k$, $BLR_k$ are precharged to ground; of course, other precharge voltages may be used if desired.

For this example in which FRAM cell $4_{j,k}$ is to be read, word line $WL_j$ for its row j is then energized by row decoder 33, at time t1, in response to the row portion of a received memory address indicating selection of row j. Pass transistor 6 in cell $4_{j,k}$ is turned on at this point, as are the pass transistors 6 in each of the cells 4 in row j. In this example, control signal PC to precharge circuitry $31_k$ is then driven inactive by control logic 36 to release bit lines $BL_k$, $BLR_k$ from being actively pulled to ground. By energizing word line $WL_j$ prior to turning off bit line precharge, the precharge of bit lines $BL_k$, $BLR_k$ also precharges the cell storage nodes to ground, prior to the plate line pulse. Alternatively, bit line precharge may be terminated prior to assertion of word line $WL_j$, if desired.

Charge transfer from the selected cells 4 occurs in response to the assertion of plate line $PL_j$, which occurs at time t2 in the example of FIG. 7a. According to this embodiment of the invention, plate line $PL_j$ for selected row j is driven to boost voltage $V_{dd}+\Delta V$, which is elevated relative to the voltage applied to word line $WL_j$, which in this case is at or near power supply voltage $V_{dd}$ as shown. In the example of FIG. 5, boost circuit 34 provides this boost voltage $V_{dd}+\Delta V$ directly, in a regulated manner, or alternatively provides an incremental voltage (e.g., $\Delta V$) to be added to power supply voltage $V_{dd}$, in either case resulting in boost voltage $V_{dd}+\Delta V$ being applied by plate line driver 32 to plate line $PL_j$ following time t2. This elevated plate line voltage $V_{dd}+\Delta V$ causes charge transfer from ferroelectric capacitor 5 of cells 4 in the selected row j, including cell $4_{j,k}$ shown in FIG. 5.

Figure 1B:
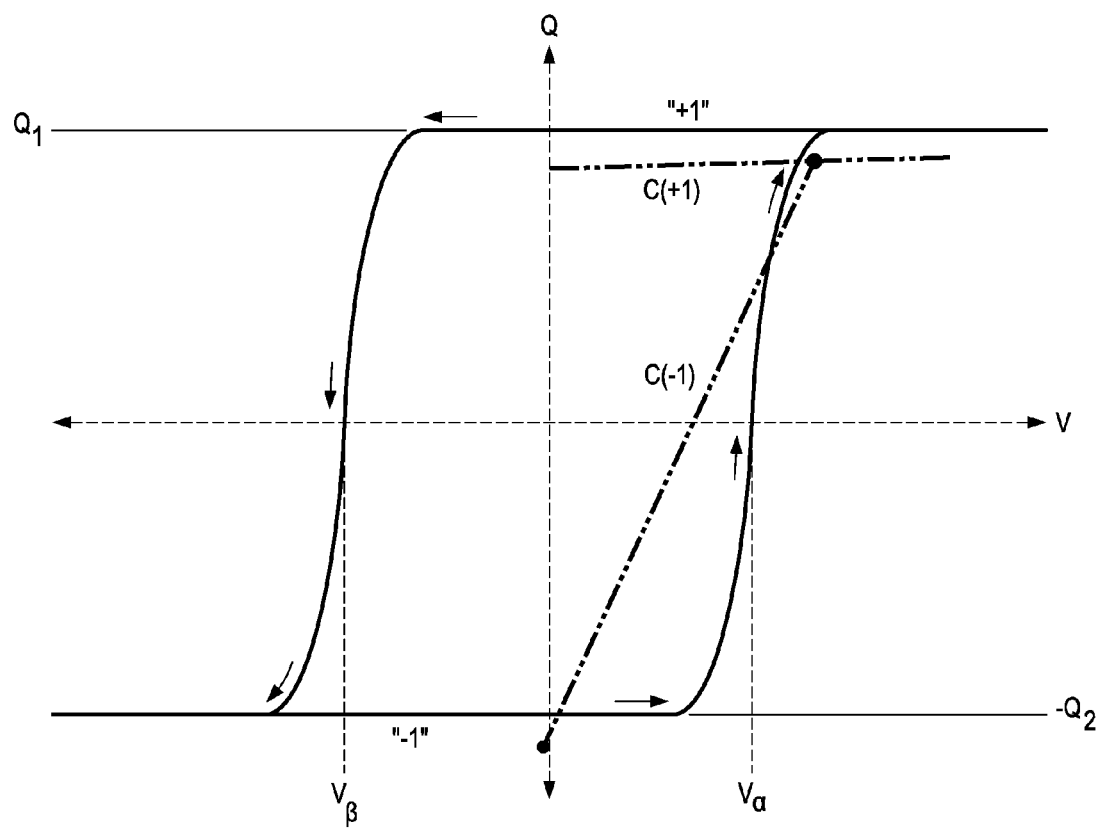
FIG. 1b is a plot of the charge-voltage polarization characteristic of a typical conventional ferroelectric capacitor.

Referring back to FIG. 1b, the amount of charge transferred from ferroelectric capacitor 5 in selected cell $4_{j,k}$ in response to the application of a positive plate line voltage relative to the bit line voltage depends on the polarization state of that ferroelectric capacitor 5, and thus on the data state previously stored in that cell $4_{j,k}$. As evident from the polarization characteristic of FIG. 1b, the application of a positive voltage (plate line relative to bit line) causes capacitor 5 to exhibit a relatively large capacitance (i.e., a steep slope of charge per unit voltage) from a polarization state of "−1" (data state "1"), but a much smaller capacitance (i.e., a shallower slope of charge/voltage) from a polarization state of "+1" (data state "0"). In the context of FRAM cell $4_{j,k}$, the larger amount of charge presented by capacitor 5 storing a "1" data state ("−1" polarization state) is reflected in a higher resultant voltage at bit line $BL_k$ (shown in FIG. 7a by plot $BL_k(D1)$) than is placed on bit line $BL_k$ by cell $4_{j,k}$ storing a "0" data state (plot $BL_k(D0)$).

According to this embodiment of the invention, the plate line voltage $V_{dd}+\Delta V$ applied to selected cell $4_{j,k}$ exceeds the nominal coercive voltage $+V_\alpha$ required to fully polarize ferroelectric capacitor 5 in selected cell $4_{j,k}$ to a "+1" polarization state ("0" data state), if that "0" data state was previously stored by that cell $4_{j,k}$. If cell $4_{j,k}$ stored a "1" data state, the plate line boost voltage of $V_{dd}+\Delta V$ is not sufficient to polarize a full "+1" data state, because of the higher voltage present on bit line $BL_k$ due to charge transfer in that case. For example, a simulated example of this embodiment of the invention in which power supply voltage $V_{dd}$ is nominally 1.50 volts and in which nominal coercive voltage $+V_\alpha$ is about 1.35 volts, results in the following voltages during the "read" pulse (between times t2 and t3 of FIG. 7a:

| Element | Voltage |
| --- | --- |
| Word line $WL_j$ | 1.50 volts |
| Plate line $PL_j$ boost voltage $V_{dd} + \Delta V$ | 1.80 volts |
| Bit line $BL_k$ for "1" data state | 0.85 volts |
| $BL_k(D1)$ | (VPL − VBL = 0.95 v) |
| Bit line $BL_k$ for "0" data state | 0.43 volts |
| $BL_k(D0)$ | (VPL − VBL = 1.37 v) |

As evident from this example, the plate line to bit line difference voltage (VPL−VBL) for a cell $4_{j,k}$ storing a "0" data state is sufficient to fully polarize the "0" data state back into its capacitor 5.

Following the "read" pulse including the elevated plate line voltage $V_{dd}+\Delta V$, plate line $PL_j$ is driven back to at or near ground, at time t3. Following time t3, the charged state of bit line $BL_k$ can be sensed by sense amplifier $45_k$, by transfer gate signal T-gate being asserted by control logic 36, and by the assertion of head and tail enable signals SAE_, SAE, respectively, by control logic 36. Conventional sensing and amplification of bit line $BL_k$ is carried out during this interval, including the amplification of the sensed data state by differential amplifier action of sense amplifier $45_k$, isolation of sense amplifier $45_k$ from bit line $BL_k$ by transfer gate $44_k$ being turned off, and communication of the data state to ECC circuitry 50 via data input/output lines $DIO_k$ via column enable transistors $46_k$ under the control of control signal SARW from column decoder 30.

In the alternative to this "off-pulse" sensing, the sensing operation may performed "on-pulse", during the time that plate line $PL_j$ is asserted to its boost voltage $V_{dd}+\Delta V$. However, the read margin of this "on-pulse" sensing is generally reduced from that of "off-pulse" sensing, due to the closer bit line voltages of presented by the two data states during the plate line pulse.

Figure 2:
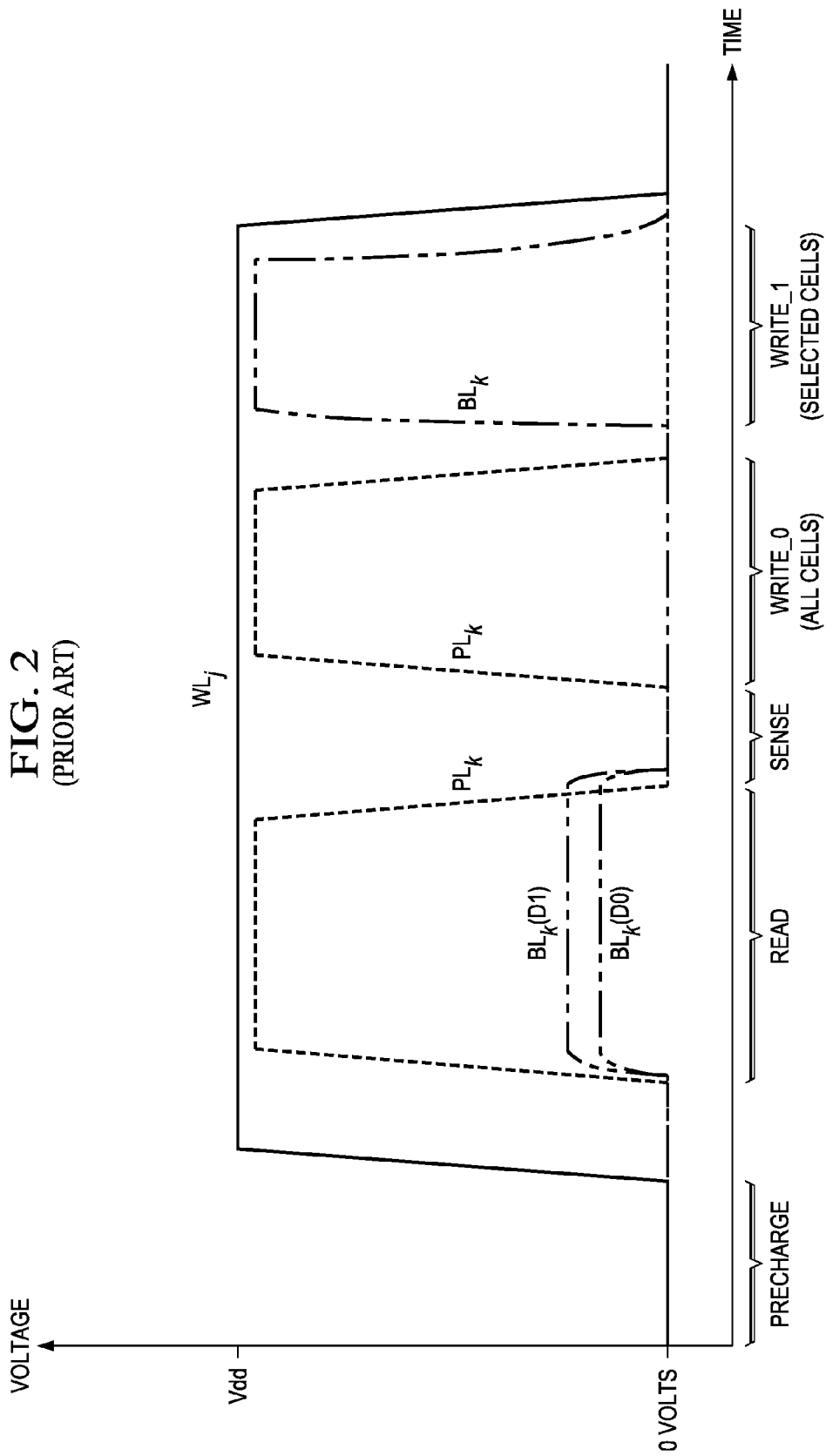
FIG. 2 is a timing diagram illustrating the operation of a conventional ferroelectric random access memory (FRAM) in performing a read cycle.

According to this embodiment of the invention, because cell $4_{j,k}$ is fully polarized into a "0" data state ("+1" polarization state) during the "read" pulse by the elevated plate line voltage $V_{dd}+\Delta V$, the rewriting of all cells 4 in row j with the "0" data state, by a dedicated write-back plate line pulse (FIG. 2), is unnecessary. According to this embodiment of the invention, those cells that previously stored a "0" data state instead remain fully polarized in that state following the "read" pulse; for this "0" data state, the read is essentially non-destructive. Only those cells 4 in selected row j that previously stored a "1" data state need be rewritten. Referring back to FIG. 7a, the rewriting of cells 4 in selected row j to this "1" data state ("−1" polarization state) is performed beginning at time t5, with the driving of bit line $BL_k$ to a high voltage (at or near power supply voltage $V_{dd}$). In the example of column k in FIG. 5, this operation can be effected by write circuit $48_k$ in response to the data state on data input/output lines $DIO_k$, under the control of control logic 36. Meanwhile, plate line drivers 32 maintain plate line $PL_j$ at or near ground, so that the voltage cross capacitor 5 in the selected cells 4 of selected row j receive a full coercive voltage $-V_\beta$ and are thus fully polarized to the "1" data state during this pulse. Bit line $BL_k$ is de-asserted at time t6, ending this writeback pulse. Those cells 4 in selected row j that previously stored a "1" data state thus are rewritten back with that data state.

As shown in FIG. 7a, this read cycle then ends with the de-assertion of word line $WL_j$ by row decoder 33 at time t7. The previously stored data states are thus returned into cells 4 of selected row j, awaiting the next access.

According to this embodiment of the invention, the writeback of data states into cells 4 of selected row j is based on the stored data states as sensed within the cycle, and cannot readily incorporate error correction results from ECC circuit 50 in the example of FIG. 5. For the case in which selected cell $4_{j,k}$ erroneously presents a "1" data state (either by storing the wrong data state, or as sensed at bit line $BL_k$), the erroneous "1" data state presented at bit line $BL_k$ prevents cell $4_{j,k}$ from being fully written to a "0". Because the conventional "0" write-back operation is eliminated according to this embodiment of the invention, the opportunity to provide a full "0" state write-back following error correction is precluded.

According to an alternative embodiment of the invention, error correction can be incorporated into the combined read/writeback cycle, as will now be described in connection with the timing diagram of FIG. 7b.

The read of cell $4_{j,k}$ according to this embodiment of the invention includes the precharge and release of bit lines $BL_k$, $BLR_k$ by precharge circuitry $31_k$ following time t0, as before.

And as before, word line $WL_j$ for selected row j is energized by row decoder 33 at time t1, in response to the received row address selecting that row j. The top plates of ferroelectric capacitors 5 in each of the cells 4 in row j are coupled to the respective bit lines BL by this action.

At time t2, plate line drivers 32, with the assistance of boost regulator 34 (FIGS. 4 and 5) or boost circuit 34' (FIG. 6), apply a boost voltage $V_{dd}+\Delta V'$ to plate line $PL_j$ to effect charge transfer from the selected cells 4 in row j. According to this embodiment of the invention, boost voltage $V_{dd}+\Delta V'$ is at a voltage sufficiently higher than power supply voltage $V_{dd}$ that the voltage difference between plate line PLj and bit line $BL_k$ exceeds coercive voltage $+V_\alpha$ regardless of the data state stored by selected cell $4_{j,k}$. As shown in FIG. 7b, the difference in voltage between boost voltage $V_{dd}+\Delta V'$ at plate line $PL_j$ and the bit line voltage of plot $BL_k(D1)$ for the "1" stored data state ("−1" polarization state), following time t2, exceeds coercive voltage $+V_\alpha$. Of course, because the bit line voltage for the "0" data state (plot $BL_k(D0)$ after time t2) is lower than that of the "1" stored data state, the plate line boost voltage $V_{dd}+\Delta V'$ also exceeds coercive voltage $+V_\alpha$ for that data and polarization state as well. Accordingly, during the plate line pulse following time t2 in the cycle of FIG. 7b, charge is transferred from selected cell $4_{j,k}$ to bit line $BL_k$, and a fully-polarized "0" data state ("+1" polarization state) is written into selected cell $4_{j,k}$, for either data state.

A simulated example of the voltages applied according to this embodiment of the invention, in FRAM 18 having a nominal power supply voltage $V_{dd}$ of 1.50 volts and a nominal coercive voltage $+V_\alpha$ of about 1.35 volts, is as follows:

| Element | Voltage |
| --- | --- |
| Word line $WL_j$ | 1.50 volts |
| Plate line $PL_j$ boost voltage $V_{dd} + \Delta V'$ | 2.50 volts |
| Bit line $BL_k$ for "1" data state | 1.12 volts |
| $BL_k(D1)$ | (VPL − VBL = 1.38 v) |
| Bit line $BL_k$ for "0" data state | 0.51 volts |
| $BL_k(D0)$ | (VPL − VBL = 1.99 v) |

The higher bit line voltages in this example result from the higher plate line boost voltage $V_{dd}+\Delta V'$, which causes more charge transfer to bit line $BL_k$ than in the embodiment of the invention shown in FIG. 7a. As evident from this example, the plate line to bit line difference voltage (VPL−VBL) for a cell $4_{j,k}$ is sufficient, regardless of data state, to fully polarize a "0" data state into its capacitor 5.

As in the embodiment of the invention shown in FIG. 7a, plate line boost voltage $V_{dd}+\Delta V'$ is generated by plate line drivers 32, in combination with boost regulator 34 or boost circuit 34', depending on the desired implementation. However, it is contemplated that this elevated boost voltage $V_{dd}+\Delta V'$ will be more readily generated by boost regulator 34 in the form of a voltage regulator, as opposed to the bootstrap mechanism of boost circuit 34', because of the larger desired voltage magnitude.

The cycle of FIG. 7b continues, after the "read" plate line pulse of the plate line boost voltage $V_{dd}+\Delta V'$, with plate line $PL_j$ driven back to ground at time t3, after which bit line $BL_k$ is sensed by sense amplifier $45_k$ upon control logic 36 asserting transfer gate signal T-gate and sense amplifier enable signals SAE_, SAE. Following sensing and amplification of the level at bit line $BL_k$ relative to that of reference bit line $BLR_k$, sense amplifier $45_k$ is isolated from bit line $BL_k$ by control logic 36 turning transfer gate $44_k$ off (at about time t4). The amplified sensed data state at the sense nodes of sense amplifier $45_k$ are then applied to data input/output lines $DIO_k$, for communication to ECC circuitry 50, upon assertion of control signal SARW by column decoder 30.

As mentioned above, according to this embodiment of the invention, each cell $4_{j,k}$ is fully polarized into a "0" data state ("+1" polarization state) by the elevated plate line voltage $V_{dd}+\Delta V$. Accordingly, there is no need to rewrite any cell 4 in selected row j with the "0" data state, both for those cells that previously stored a "0" data state and those cells 4 that previously stored a "1" data state. Beginning at time t5 in the read cycle shown in FIG. 7b, selected cells 4 in this selected row j of array 26 are next written to a "1" data state by write circuit 48 (for each column involved) driving the corresponding bit lines BL high, to a voltage near power supply voltage $V_{dd}$, while maintaining plate line $PL_j$ at ground level and word line $WL_j$ high. The bit line to plate line voltage difference established after time t5 should exceed (in magnitude) coercive voltage $+V_\beta$.

In this case, the results of error detection and correction by ECC circuit 50 can be used in determining which cells 4 in row j are written back with a full "1" state. The written-back cells by the bit line pulse at time t5 include those cells 4 in row j that previously and correctly stored a "1" data state, and also any cells 4 in row j that previously stored a "0" data state in error (or for which a "0" data state was erroneously sensed), as determined by ECC circuit 50. In addition, those cells 4 in row j that previously but erroneously stored a "1" data state (or for which a "1" data state was erroneously sensed in this cycle), as determined by ECC circuit 50, are not written back with a "1" data state in the write-back pulse beginning at time t5. According to this embodiment of the invention, therefore, the results of error correction can be utilized in writing-back the proper data state to each cell 4 in selected row j in this same read cycle. This ensures that bit errors do not accumulate within FRAM 18, while still attaining the benefits of the reduced cycle time.

The read cycle then ends with the de-assertion of word line $WL_j$ by row decoder 33 at time t7. The previously stored, or corrected, data states are thus returned into cells 4 of selected row j, awaiting the next access.

As evident from each of the embodiments of the invention described above relative to FIGS. 7a and 7b, these embodiments of the invention enable dramatic shortening of the cycle time for accessing a non-volatile ferroelectric memory such as FRAM 18. Specifically, one of the three "pulse" portions within the overall read cycle can be eliminated, namely the write-back of all cells to a "0" data state ("+1" polarization state). The overall memory access performance is therefore greatly improved, at minimal cost from the standpoint of circuit complexity and chip area.

While this invention has been described according to its embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

What is claimed is:

1. A method of operating a ferroelectric memory to read a stored data state from a selected memory cell, the memory cell having a ferroelectric capacitor with first and second plates, and a pass transistor connected between the second plate of the capacitor and a bit line, the ferroelectric capacitor capable of being polarized into first and second data states, the method comprising the steps of:

precharging the bit line associated with the selected memory cell;

energizing a word line connected to the gate of the pass transistor to cause conduction between the second plate of the ferroelectric capacitor and the bit line;

performing a charge transfer operation during the energizing step by applying a boost voltage to the first plate of the ferroelectric capacitor of the selected memory cell;

then sensing the stored data state of the selected memory cell from the bit line occurring responsive to the step of performing the charge transfer operation;

then performing a single write-back during the energizing step, responsive to the stored data state being the second data state, by applying a voltage to the bit line associated with the selected memory cell, the voltage sufficient so that a differential voltage between that bit line and the first plate of the selected memory cell exceeds a coercive voltage of the ferroelectric capacitor corresponding to the second data state; and then de-energizing the word line.

2. The method of claim 1, wherein the boost voltage applied in the charge transfer operation is sufficient so that a differential voltage between the first plate and the bit line associated with the selected memory cell exceeds a first coercive voltage of the ferroelectric capacitor for the selected memory cell corresponding to the first data state.

3. The method of claim 2, further comprising:
performing error correction on the sensed stored data state;
wherein the step of performing the single write-back is performed responsive to the stored data state of the selected memory cell being the second data state, after error correction.

4. The method of claim 1, wherein the boost voltage applied in the charge transfer operation is insufficient for the differential voltage between the first plate and the bit line associated with the selected memory cell to exceed the first coercive voltage of the ferroelectric capacitor for the selected memory cell, if the stored data state of the selected memory cell is the second data state.

5. The method of claim 1, wherein the precharging step, and the steps of performing a charge transfer operation, sensing, and performing a single write-back, are performed for a plurality of memory cells arranged in a selected row of memory cells in the ferroelectric memory.

6. The method of claim 5, wherein the step of performing the single write-back comprises:
applying a voltage to the bit lines associated with the identified ones of the plurality of memory cells, sufficient so that a differential voltage between that bit line and the first plate of each of the plurality of memory cells in the selected row, for which the stored data state is the second data state, exceeds the second coercive voltage.

7. The method of claim 6, wherein the step of performing a charge transfer operation is performed by applying the boost voltage to the first plate of the ferroelectric capacitor of the plurality of memory cells in the selected row, sufficient so that a differential voltage between the first plate of each of the plurality of memory cells and its associated bit line exceeds a first coercive voltage of the ferroelectric capacitor, corresponding to the first data state, for each of the plurality of memory cells in the selected row;
and further comprising:
performing error correction on the sensed stored data states from the plurality of memory cells in the selected row;

wherein the step of performing the single write-back is performed responsive to the stored data state of the selected memory cell being the second data state, after error correction.

8. A method of operating a ferroelectric memory to read a stored data state from a selected memory cell, the memory cell having a ferroelectric capacitor comprising a first plate coupled to a plate line associated with a row containing the memory cell, a second plate, and ferroelectric material disposed between the first and second plates, wherein the capacitor is polarized to a first data state by a positive voltage greater than a first coercive voltage being applied across the first and second plates, and wherein the capacitor is polarized to a second data state by a negative voltage of a magnitude greater than a second coercive voltage being applied across the first and second plates, the method comprising the steps of:

precharging a bit line associated with the selected memory cell;

then selectively coupling, responsive to a row address, the second plate of the capacitor of the selected memory cell to the bit line;

during the selectively coupling step, applying a plate line boost voltage to the first plate of the ferroelectric capacitor of the selected memory cell sufficient that, if the stored data state of the selected memory cell is the first data state, a differential voltage between the first plate and the bit line associated with the selected memory cell exceeds the first coercive voltage of the capacitor;

then sensing the stored data state of the selected memory cell from the bit line;

then, responsive to the stored data state being a second data state, applying a write voltage to the bit line associated with the selected memory cell sufficient that a differential voltage between that bit line and the first plate of the selected memory cell exceeds the second coercive voltage of the ferroelectric capacitor; and then terminating the coupling step.

9. The method of claim 8, wherein the plate line boost voltage is sufficient so that the differential voltage between the first plate and the bit line associated with the selected memory cell exceeds the first coercive voltage of the capacitor regardless of the stored data state.

10. The method of claim 9, further comprising:
performing error correction on the sensed stored data state;
wherein the step of applying the write voltage is performed responsive to the stored data state of the selected memory cell being the second data state, after error correction.

11. The method of claim 8, wherein the plate line boost voltage is insufficient for the differential voltage between the first plate and the bit line associated with the selected memory cell to exceed the first coercive voltage if the stored data state of the selected memory cell is the second data state.

12. The method of claim 8, wherein the coupling, applying, and sensing steps are performed simultaneously for a plurality of memory cells in a selected row of memory cells in the ferroelectric memory.

13. The method of claim 8, further comprising:
then applying the write voltage to the bit lines associated with the identified ones of the plurality of memory cells in the selected row for which the stored data state is the second data state.

14. The method of claim 13, wherein the plate line boost voltage is sufficient so that the differential voltage between the first plate and the bit line associated with the selected memory cell exceeds the first coercive voltage of the capacitor regardless of the stored data state;

and further comprising:
performing error correction on the sensed stored data states from the plurality of memory cells in the selected row;
wherein the step of applying the write voltage applies the write voltage to the bit lines associated with memory cells having the second data state, after error correction.

15. A non-volatile memory, comprising:
a plurality of memory cells arranged in rows and columns, each memory cell comprising:
a capacitor having a first plate coupled to a plate line associated with a row containing the memory cell, having a second plate, and having ferroelectric material disposed between the first and second plates, wherein the capacitor is polarized to a first data state by a positive voltage greater than a first coercive voltage being applied across the first and second plates, and wherein the capacitor is polarized to a second data state by a negative voltage of a magnitude greater than a second coercive voltage being applied across the first and second plates;
a pass transistor having a source/drain path connected between the second plate of the capacitor and a bit line associated with a column containing the memory cell, and having a gate coupled to a word line associated with the row containing the memory cell;
a plurality of sense amplifiers, each coupled to one of a plurality of bit lines;
write circuitry, coupled to the plurality of bit lines;
an address decoder, biased from a power supply voltage, coupled to a plurality of word lines, and coupled to receive a row portion of a received address;
plate line driver circuitry, for applying selected voltages to one or more of a plurality of plate lines in each memory access cycle;
voltage boost circuitry, coupled to the plate line driver circuitry, for generating a boost voltage to the plate line driver circuitry, so that, during a read cycle, the plate line driver circuitry applies a plate line boost voltage to the second plate of the ferroelectric capacitor of memory cells in a selected row, the plate line boost voltage sufficient that, if the stored data state of a selected memory cell is the first data state, a differential voltage between the first plate and the bit line associated with the selected memory cells exceeds the first coercive voltage of the capacitor for that memory cell.

16. The memory of claim 15, wherein the voltage boost circuitry comprises:
a voltage regulator coupled to the plate line driver circuitry.

17. The memory of claim 15, wherein the voltage boost circuitry comprises:
a boot-strap circuit comprising a capacitor coupled to the plurality of plate lines.

18. The memory of claim 15, wherein the voltage boost circuitry generates a plate line boost voltage sufficient so that the differential voltage between the first plate and the bit line associated with the selected memory cells exceeds the first coercive voltage of the capacitor regardless of the stored data state.

19. The memory of claim 15, wherein the voltage boost circuitry generates a plate line boost voltage that is insufficient for the differential voltage between the first plate and the bit line associated with a selected memory cell to exceed the first coercive voltage if the stored data state of that selected memory cell is the second data state.

* * * * *